(12) United States Patent
Hirayama

(10) Patent No.: US 10,674,595 B2
(45) Date of Patent: Jun. 2, 2020

(54) PLASMA PROCESSING APPARATUS AND METHOD FOR CONTROLLING PLASMA PROCESSING APPARATUS

(71) Applicants: TOKYO ELECTRON LIMITED, Tokyo (JP); TOHOKU UNIVERSITY, Sendai-shi, Miyagi (JP)

(72) Inventor: Masaki Hirayama, Sendai (JP)

(73) Assignees: TOKYO ELECTRON LIMITED, Tokyo (JP); TOHOKU UNIVERSITY, Sendai-Shi, Miyagi (JP)

( * ) Notice: Subject to any disclaimer, the term of this patent is extended or adjusted under 35 U.S.C. 154(b) by 0 days.

(21) Appl. No.: 16/343,322

(22) PCT Filed: Oct. 12, 2017

(86) PCT No.: PCT/JP2017/037016
§ 371 (c)(1),
(2) Date: Apr. 18, 2019

(87) PCT Pub. No.: WO2018/074322
PCT Pub. Date: Apr. 26, 2018

(65) Prior Publication Data
US 2019/0246485 A1    Aug. 8, 2019

(30) Foreign Application Priority Data
Oct. 19, 2016   (JP) .................. 2016-205289

(51) Int. Cl.
*H05H 1/46*       (2006.01)
*H01J 37/32*      (2006.01)
(Continued)

(52) U.S. Cl.
CPC ......... *H05H 1/46* (2013.01); *H01J 37/32183* (2013.01); *H01J 37/32577* (2013.01);
(Continued)

(58) Field of Classification Search
None
See application file for complete search history.

(56) References Cited

U.S. PATENT DOCUMENTS

2015/0027637 A1\* 1/2015 Haga ................. H01J 37/32091
156/345.28
2015/0170882 A1\* 6/2015 Yamawaku ....... H01J 37/32137
438/710

FOREIGN PATENT DOCUMENTS

JP    H9-312268 A    12/1997
JP    H10-289881 A   10/1998
(Continued)

*Primary Examiner* — Jany Richardson
(74) *Attorney, Agent, or Firm* — Nath, Goldberg & Meyer; Jerald L. Meyer

(57) ABSTRACT

A plasma processing apparatus according to one embodiment includes a grounded processing container, a mounting table configured to support a workpiece inside the processing container, a plurality of electrodes arranged to face the mounting table and insulated from one another, a high frequency power supply configured to supply a high frequency power for generating plasma and electrically connected between two different electrodes out of the plurality of electrodes or between one of the plurality of electrodes and the processing container, and an impedance variable circuit configured to control an impedance and electrically connected between two different electrodes out of the plurality of electrodes or between one of the plurality of electrodes and the processing container.

24 Claims, 9 Drawing Sheets

(51) Int. Cl.
*H01L 21/3065* (2006.01)
*H01L 21/31* (2006.01)

(52) U.S. Cl.
CPC .......... *H01L 21/3065* (2013.01); *H01L 21/31* (2013.01); *H05H 2001/4682* (2013.01)

(56) References Cited

FOREIGN PATENT DOCUMENTS

| | | |
|---|---|---|
| JP | 2009-021256 A | 1/2009 |
| JP | 2012-124184 A | 6/2012 |
| JP | 2015-026475 A | 2/2015 |
| KR | 1020150013062 A | 2/2015 |
| WO | 2015/190326 A1 | 12/2015 |

\* cited by examiner

FIG. 4
<Impedance variable circuit>
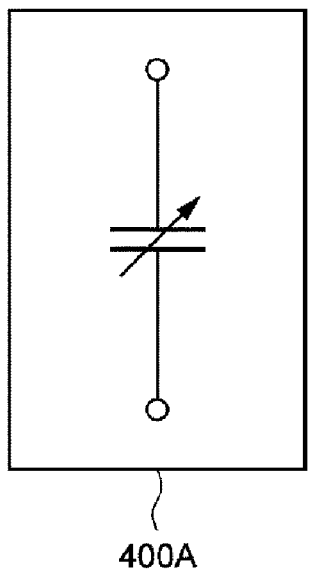 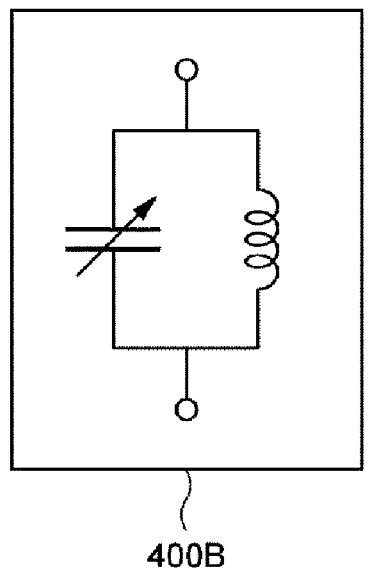 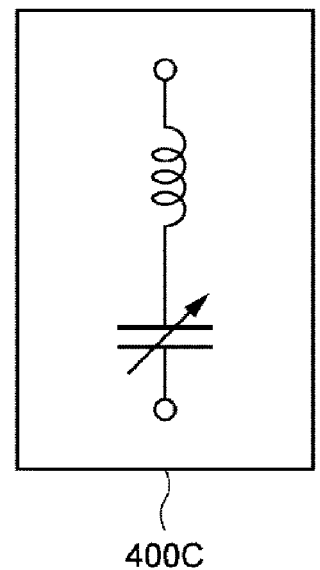
400A        400B        400C

PLASMA PROCESSING APPARATUS AND METHOD FOR CONTROLLING PLASMA PROCESSING APPARATUS

CROSS-REFERENCE

This is a National Phase Application filed under 35 U.S.C. 371 as a national stage of PCT/JP2017/037016, filed Oct. 12, 2017, an application claiming the benefit from the Japanese patent Application No. 2016-205289, filed Oct. 19, 2016, the content of each of which is hereby incorporated by reference in its entirety.

TECHNICAL FIELD

The present disclosure relates to a plasma processing apparatus for finely processing a workpiece by plasma and a method for controlling a plasma processing apparatus.

BACKGROUND

In a manufacturing process of a flat panel display, a solar cell, a semiconductor device or the like, plasma is used for thin film formation and/or etching. Plasma is generated, for example, by introducing a gas into a processing container and applying a high frequency wave of several MHz to several hundred MHz to an electrode provided in the processing container. In order to improve the productivity, the size of a silicon substrate used for manufacturing a semiconductor device tends to become large year by year. Semiconductor devices have already been mass-produced with a silicon substrate having a diameter of 300 mm.

In plasma processes such as thin film formation and/or etching, it is required to generate plasma having a higher density in order to shorten the process time and improve the productivity. In addition, it is required to generate plasma having a low electron temperature in order to lower the energy of ions incident on a substrate surface to reduce ion irradiation damage and in order to suppress excessive dissociation of gas molecules. Generally, if the plasma excitation frequency is increased, the plasma density increases, and the electron temperature decreases. Therefore, it is desirable to increase the plasma excitation frequency in order to form a high-quality thin film with a high throughput. From such a viewpoint, a high frequency wave in a VHF (Very High Frequency) band of 30 to 300 MHz, which is higher than the frequency of an ordinary high frequency power supply of 13.56 MHz, is used for plasma processing (see, for example, Patent Documents 1 and 2).

PRIOR ART DOCUMENTS

Patent Documents

Patent Document 1: Japanese patent laid-open publication No. 9-312268
Patent Document 2: Japanese patent laid-open publication No. 2009-021256

However, if the plasma excitation frequency is increased, the uniformity of a plasma density may be deteriorated due to the influence of a standing wave generated by a surface wave propagating on the surface of an electrode to which the high frequency wave is applied. Generally, when the size of the electrode to which the high frequency wave is applied becomes larger than 1/20 of the wavelength of a free space, it is difficult to excite highly uniform plasma unless some measures are taken.

For example, in the case of forming a thin film on a silicon substrate having a diameter of 300 mm by CVD (Chemical Vapor Deposition), if the plasma excitation frequency is set to 13.56 MHz, uniform plasma can be obtained. However, the plasma density is low and the electron temperature is high, which makes it difficult to form a high-quality thin film at a high speed. On the other hand, if the plasma excitation frequency is set to 100 MHz which is about 7 times as large as 13.56 MHz, the film quality and the film formation speed are improved. However, the processing uniformity is remarkably deteriorated. Even if uniform plasma can be realized by chance under a certain process condition, the uniformity may be deteriorated under another process condition. There is a strong demand for a technique capable of exciting highly uniform plasma on a substrate having a diameter exceeding 300 mm even at a high frequency of 100 MHz or more and capable of freely controlling a plasma density distribution.

In a conventional parallel plate type plasma processing apparatus, a high frequency application electrode larger than a substrate is provided on the opposing surface of the substrate. In such a plasma processing apparatus, a high frequency current flows through plasma between the high frequency application electrode and the ground such as a chamber wall or the like and between the high frequency application electrode and the substrate. In such a configuration, a standing wave is generated due to the influence of a surface wave propagating between the high frequency application electrode and the plasma. Thus, in the case of using a high plasma excitation frequency, it is difficult to generate highly uniform plasma. It is also not possible to control the plasma density distribution.

The present disclosure provides some embodiments of a plasma processing apparatus and a method for controlling a plasma processing apparatus, which are capable of changing the flow of a high frequency current between electrodes or between an electrode and a ground by providing an electrode to which a high frequency wave is applied and an electrode to which an impedance variable circuit is connected and by changing the impedance of the electrodes, and which are capable of controlling a plasma density distribution even when plasma is generated at a high excitation frequency of, for example, a VHF band.

SUMMARY

According to one aspect of the present disclosure, there is provided a plasma processing apparatus including: a grounded processing container; a mounting table configured to support a workpiece inside the processing container; a plurality of electrodes arranged to face the mounting table and insulated from one another; a high frequency power supply configured to supply a high frequency power for generating plasma, and electrically connected between two different electrodes out of the plurality of electrodes or between one of the plurality of electrodes and the processing container; and an impedance variable circuit configured to control an impedance, and electrically connected between two different electrodes out of the plurality of electrodes or between one of the plurality of electrodes and the processing container.

In one embodiment, the plurality of electrodes may include a first electrode and a second electrode, the high frequency power supply may be electrically connected between the second electrode and the processing container, and the impedance variable circuit may be connected between the first electrode and the processing container.

In one embodiment, the first electrode may be a disk-shaped center electrode, the second electrode may be an annular electrode surrounding an outer periphery of the center electrode, and the high frequency power supply may be electrically connected to the annular electrode and the processing container via a matching device.

In one embodiment, the annular electrode and the center electrode may be formed of metal members, and an insulator member may be interposed between the annular electrode and the center electrode.

In one embodiment, the apparatus may further include a first coaxial tube, wherein one end of an inner conductor of the first coaxial tube may be connected to the impedance variable circuit, and the other end of the inner conductor may be connected to the center electrode.

In one embodiment, the apparatus may further include a second coaxial tube including an inner conductor having a first portion and a plurality of second portions branched from the first portion, wherein an end portion of the first portion may be connected to the matching device, and end portions of the plurality of second portions may be connected to the annular electrode at positions axially symmetrical with respect to an axis passing through a center of the center electrode.

In one embodiment, an outer periphery of the workpiece, an outer periphery of a surface of the center electrode facing the mounting table, an inner periphery of a surface of the annular electrode facing the mounting table, and an outer periphery of the surface of the annular electrode facing the mounting table may be circular, and the workpiece, the center electrode, and the annular electrode may have a relationship of an outer diameter of the surface of the annular electrode facing the mounting table>an outer diameter of the workpiece>an inner diameter of the surface of the annular electrode facing the mounting table>an outer diameter of the surface of the center electrode facing the mounting table.

In one embodiment, the plurality of electrodes may include a first electrode, a second electrode, and a third electrode, the high frequency power supply may be electrically connected between the second electrode and the third electrode, and the impedance variable circuit may be electrically connected between the first electrode and the third electrode.

In one embodiment, the high frequency power supply may be electrically connected between the second electrode and the third electrode via a matching device, and the third electrode may be grounded via the matching device and the high frequency power supply.

In one embodiment, a common mode choke may be provided in at least a part of a high frequency transmission path connecting the high frequency power supply and the third electrode.

In one embodiment, the first electrode may be a disk-shaped center electrode, the second electrode may be an annular electrode surrounding an outer periphery of the center electrode, and the third electrode may be an outer peripheral electrode surrounding an outer periphery of the annular electrode.

In one embodiment, the center electrode, the annular electrode, and the outer peripheral electrode may be formed of metal members, and an insulator member may be interposed between the center electrode and the annular electrode and between the annular electrode and the outer peripheral electrode.

In one embodiment, the apparatus may further include a first coaxial tube, wherein one end of an inner conductor of the first coaxial tube may be connected to the impedance variable circuit, and the other end of the inner conductor may be connected to the center electrode.

In one embodiment, the apparatus may further include a second coaxial tube including an inner conductor having a first portion and a plurality of second portions branched from the first portion, wherein an end portion of the first portion may be connected to the matching device, and end portions of the plurality of second portions may be connected to the annular electrode at positions axially symmetrical with respect to an axis passing through a center of the center electrode.

In one embodiment, the plurality of electrodes may include a first electrode and a second electrode, the high frequency power supply may be electrically connected between the first electrode and the second electrode, and the impedance variable circuit may be connected between the second electrode and the processing container.

In one embodiment, the high frequency power supply may be electrically connected to the first electrode and the second electrode via a matching device, and the second electrode may be grounded via the matching device and the high frequency power supply.

In one embodiment, the first electrode may be a disk-shaped center electrode, and the second electrode may be an outer peripheral electrode surrounding an outer periphery of the center electrode.

In one embodiment, the center electrode and the outer peripheral electrode may be formed of metal members, and an insulator member may be interposed between the center electrode and the outer peripheral electrode.

In one embodiment, the apparatus may further include a first coaxial tube, wherein one end of an inner conductor of the first coaxial tube may be connected to the matching device, and the other end of the inner conductor may be connected to the center electrode.

In one embodiment, one end of the inner conductor of the first coaxial tube may be electrically short-circuited from an end portion of an outer conductor of the first coaxial tube.

In one embodiment, the apparatus may further include a second coaxial tube having one end electrically connected to the first coaxial tube and the other end electrically connected to the matching device.

In one embodiment, an outer periphery of the workpiece, an outer periphery of a surface of the center electrode facing the mounting table, an inner periphery of a surface of the outer peripheral electrode facing the mounting table, and an outer periphery of the surface of the outer peripheral electrode facing the mounting table may be circular, and the workpiece, the center electrode, and the outer peripheral electrode may have a relationship of an outer diameter of the surface of the outer peripheral electrode facing the mounting table>an outer diameter of the workpiece>an inner diameter of the surface of the outer peripheral electrode facing the mounting table>an outer diameter of the surface of the center electrode facing the mounting table.

In one embodiment, the impedance variable circuit may be connected to the outer peripheral electrode at a plurality of positions axially symmetrical with respect to an axis passing through a center of the center electrode.

In one embodiment, the end portions of the plurality of second portions may be connected to the annular electrode at positions equidistant in a circumferential direction of the annular electrode.

In one embodiment, the annular electrode may be divided into a plurality of regions at equal intervals in a circumferential direction of the annular electrode.

According to another aspect of the present disclosure, there is provided a method for controlling a plasma processing apparatus including a grounded processing container, a mounting table configured to support a workpiece inside the processing container, a plurality of electrodes arranged to face the mounting table and insulated from one another, a high frequency power supply configured to supply a high frequency power for generating plasma and electrically connected between two different electrodes out of the plurality of electrodes or between one of the plurality of electrodes and the processing container, an impedance variable circuit configured to control an impedance and electrically connected between two different electrodes out of the plurality of electrodes or between one of the plurality of electrodes and the processing container, and a monitor configured to measure a high frequency amplitude or a direct current potential on a surface of one electrode among the plurality of electrodes, the one electrode being connected to the impedance variable circuit, and the surface facing the mounting table, the method including: acquiring the high frequency amplitude or the direct current potential measured by the monitor; and controlling the impedance of the impedance variable circuit so that the high frequency amplitude or the direct current potential is set to a target value.

According to one aspect and various embodiments of the present disclosure, it is possible to control a plasma density distribution even when plasma is generated at a high excitation frequency.

BRIEF DESCRIPTION OF DRAWINGS

FIG. 4 is a view showing examples of impedance variable circuits according to first to sixth embodiments.

DETAILED DESCRIPTION

Figure 1:
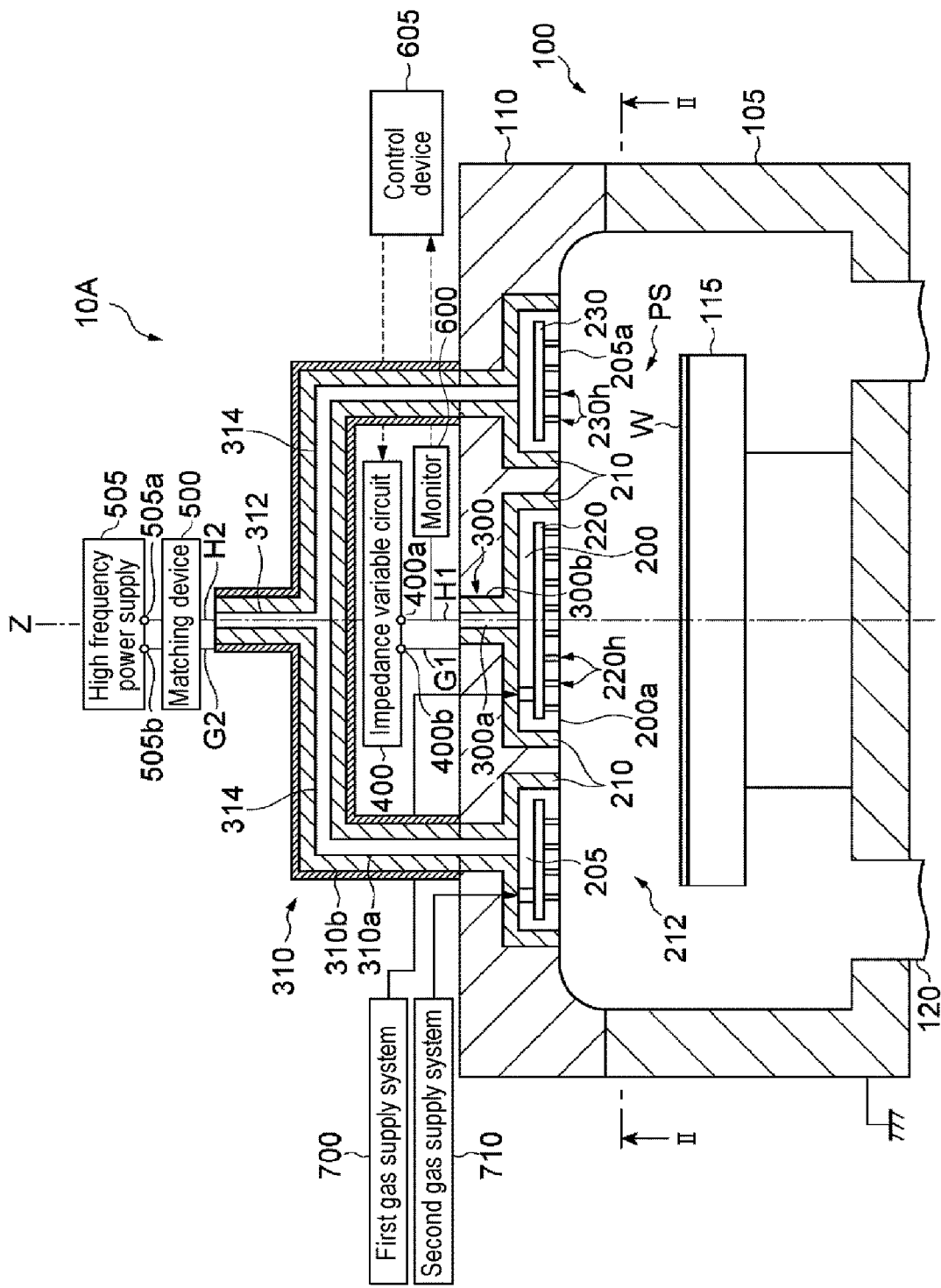
FIG. 1 is a vertical sectional view of a plasma processing apparatus according to a first embodiment.

Embodiments of the present disclosure will be described in detail with reference to the accompanying drawings. In the subject specification and the drawings, constituent elements having substantially the same functional configurations are designated by the same reference numerals. Redundant explanations are omitted.

First Embodiment

[Configuration of Plasma Processing Apparatus]

Figure 2:
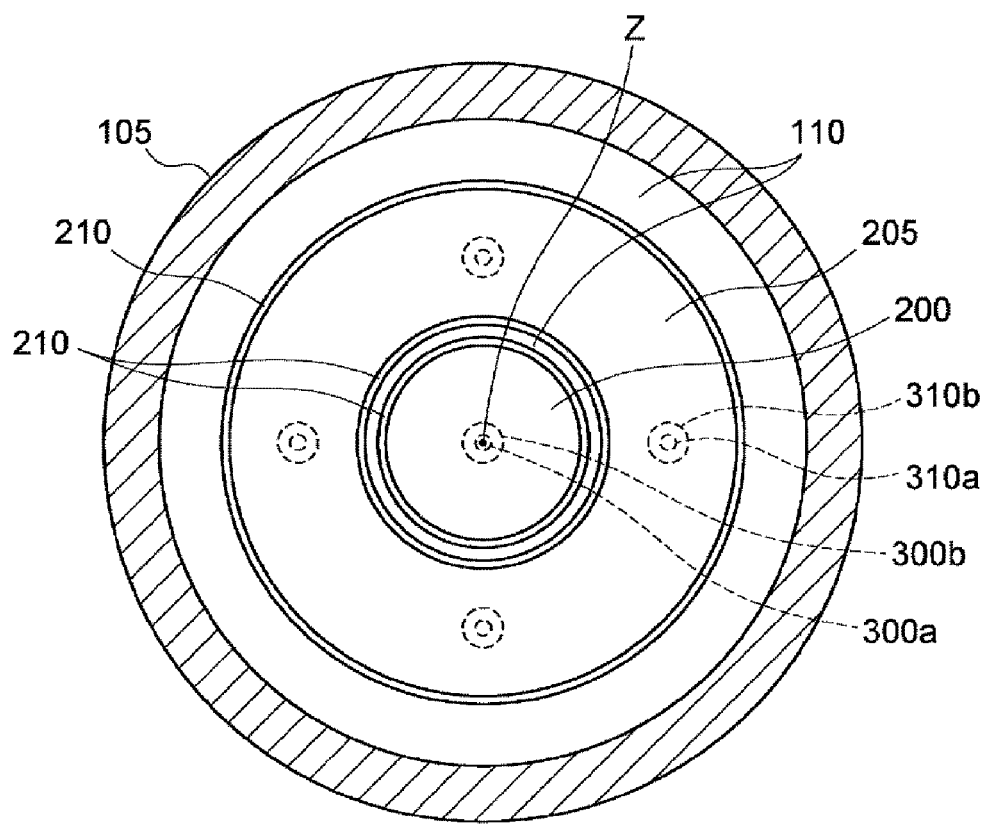
FIG. 2 is a view showing an example of a cross section taken along line II-II in FIG. 1.

First, the configuration of a plasma processing apparatus according to a first embodiment of the present disclosure will be described with reference to FIGS. 1 and 2. FIG. 1 is a vertical sectional view of a plasma processing apparatus according to a first embodiment of the present disclosure, and FIG. 2 is a sectional view of the plasma processing apparatus taken along line II-II in FIG. 2.

The plasma processing apparatus 10A shown in FIG. 1 includes a processing container 100, a mounting table 115, an upper electrode 212, an impedance variable circuit 400, and a high frequency power supply 505. The processing container 100 defines a processing space PS for plasma-processing a workpiece (hereinafter referred to as a substrate W) such as a silicon substrate or the like. The processing container 100 has a rectangular cross section. The processing container 100 is made of a metal such as an aluminum alloy or the like and is grounded. The processing container 100 includes a container body 105 and a lid 110. The container body 105 has a side wall and a bottom wall. The side wall of the container body 105 forms a tubular body. The lid 110 is attached to the container body 105 so as to close the upper opening of the container body 105. The lid 110 is grounded via the container body 105. An O-ring is provided between the container body 105 and the lid 110 so that the airtightness in the processing container 100 is maintained.

The mounting table 115 is disposed on the lower side inside the processing container 100. A substrate W is supported on the upper surface of the mounting table 115. Furthermore, an exhaust port 120 is formed in the bottom wall of the processing container 100. The gas in the processing container 100 is exhausted from the exhaust port 120 by a vacuum pump (not shown).

The upper electrode 212 is provided on the surface (ceiling surface) of the processing container 100 opposed to the substrate side, i.e., in the upper portion of the processing container 100, so as to face the mounting table 115. The upper electrode 212 includes a plurality of electrodes, i.e., a center electrode 200 and an annular electrode 205. The center electrode 200 is formed in a disc shape and is located at the center of the ceiling surface. The annular electrode 205 is a ring shape and is provided so as to surround the outer periphery of the center electrode 200. In one embodiment, the center electrode 200 and the annular electrode 205 are formed from metal members. The outer peripheral surface and the upper surface of the center electrode 200 are covered with an insulator member 210. Furthermore, the inner peripheral surface, the outer peripheral surface, and the upper surface of the annular electrode 205 are covered with the insulator member 210. That is, the insulator member 210 is interposed between the center electrode 200 and the annular electrode 205. The center electrode 200 and the annular electrode 205 are insulated from each other by the insulator member 210. The insulator member 210 is made of, for example, a dielectric material such as alumina or quartz.

Furthermore, in one embodiment, a gas diffusion chamber 220 may be formed inside the center electrode 200, and a gas diffusion chamber 230 may be formed inside the annular electrode 205. A plurality of gas holes 220h communicating with the processing space PS extends downward from the gas diffusion chamber 220, and a plurality of gas holes 230h communicating with the processing space PS extends downward from the gas diffusion chamber 230. A first gas supply system 700 and a second gas supply system 710 are connected to the gas diffusion chamber 220 and the gas diffusion chamber 230, respectively, via gas supply pipes. The first gas supply system 700 and the second gas supply system 710 are configured to supply gases to the gas diffusion chamber 220 and the gas diffusion chamber 230, respectively, at a predetermined flow rate ratio. The gases supplied to the gas diffusion chamber 220 and the gas diffusion chamber 230 are dispersed and supplied in a shower shape into the processing container 100 via the gas holes 220h and the gas holes 230h.

The impedance variable circuit 400 is an electric circuit capable of controlling impedance and is electrically connected between two different electrodes out of a plurality of electrodes of the upper electrode 212, or between one electrode out of the plurality of electrodes of the upper electrode 212 and the processing container. In the embodiment shown in FIG. 1, the impedance variable circuit 400 includes a first connection terminal 400a and a second connection terminal 400b. The first connection terminal 400a is electrically connected to the center electrode 200 via a line H1 and an inner conductor 300a to be described later, and the second connection terminal 400b is electrically connected to the lid 110 of the processing container 100 via a line G1. That is, the impedance variable circuit 400 is electrically connected between the center electrode 200 and the grounded processing container 100.

FIG. 4 is a circuit diagram showing configuration examples of the impedance variable circuit 400. As shown in FIG. 4, a configuration 400A consisting only of a variable capacitor, a configuration 400B in which a variable capacitor and a coil are connected in parallel, and a configuration 400C in which a variable capacitor and a coil are connected in series, may be considered as the impedance variable circuit 400.

In one embodiment, the plasma processing apparatus 10A may further include a first coaxial tube 300. The first coaxial tube 300 is formed of the inner conductor 300a and an outer conductor 300b. The inner conductor 300a extends so as to penetrate the lid 110 of the processing container 100 and the insulator member 210. One end of the inner conductor 300a is connected to a first connection terminal 400a of the impedance variable circuit 400 via a line H1. The other end of the inner conductor 300a is connected to the center electrode 200. According to such a configuration, the impedance between the center electrode 200 and the ground can be changed by the impedance variable circuit 400 connected to the center electrode 200 and the ground surface of the processing container 100.

In one embodiment, the plasma processing apparatus 10A may further include a second coaxial tube 310. The second coaxial tube 310 includes an inner conductor 310a and an outer conductor 310b. The second coaxial tube 310 is branched into a plurality of coaxial tubes at an intermediate position in the longitudinal direction. In the present embodiment, the second coaxial tube 310 is branched into four coaxial tubes. The number of branches of the second coaxial tube 310 is not limited to four branches and may be, for example, two branches, eight branches, or other number of branches. The inner conductor 310a of the second coaxial tube 310 includes a first portion 312 and a plurality of second portions 314 branched from the first portion 312. An end portion of the first portion 312 of the inner conductor 310a is connected to the high frequency power supply 505 via a matching device 500. The plurality of second portions 314 of the inner conductor 310a extends so as to penetrate the lid 110 of the processing container and the insulator member 210, and the end portions of the second portions 314 are connected to the annular electrode 205. In addition, the insulator member 210 is connected to a dielectric body embedded between the inner conductor 300a and the outer conductor 300b or a dielectric body embedded between the inner conductor 310a and the outer conductor 310b.

The high frequency power supply 505 supplies a high frequency wave for plasma generation. The high frequency power supply 505 is electrically connected between two different electrodes out of the plurality of electrodes of the upper electrode 212 or between one electrode out of the plurality of electrodes of the upper electrode 212 and the processing container 100. In the present embodiment, the high frequency power supply 505 includes a first power supply terminal 505a and a second power supply terminal 505b. The first power supply terminal 505a is electrically connected to the annular electrode 205 via a line H2 and the inner conductor 310a of the second coaxial tube 310. The second power supply terminal 505b is electrically connected to the lid 110 of the processing container 100 via a line G2 and the outer conductor 310b of the second coaxial tube 310. That is, the high frequency power supply 505 is electrically connected between the annular electrode 205 and the grounded processing container 100.

As shown in FIG. 2, the center electrode 200 and the annular electrode 205 are separated by the insulator member 210. The other end of the first coaxial tube 300 is connected to the center position of the upper surface of the center electrode 200. The second coaxial tube 310 is arranged at a position axially symmetrical with respect to the axis Z passing through the center of the center electrode 200. In one embodiment, the plurality of end portions of the second coaxial tube 310 may be connected to the annular electrode 205 at the positions equally spaced apart in the circumferential direction of the annular electrode 205.

Figure 3:
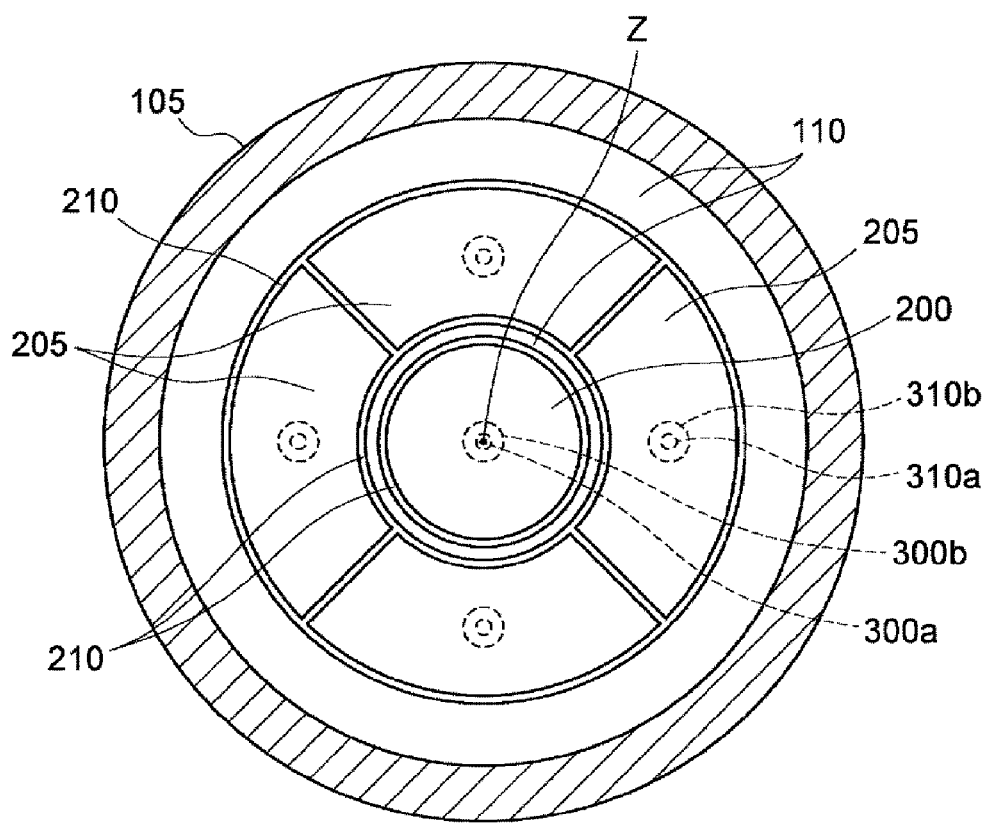
FIG. 3 is a view showing another example of a cross section taken along line II-II in FIG. 1.

Furthermore, in another embodiment, the annular electrode 205 may be divided at equal intervals in the circumferential direction of the annular electrode 205. In the embodiment shown in FIG. 3, the annular electrode 205 is divided into four regions by the insulator member 210, and the end portions of the second coaxial tube 310 serving as power supply points are connected to the respective regions. By dividing the annular electrode 205 as a high frequency application electrode in the circumferential direction, it is possible to shorten the propagation distance of the surface wave propagating on the surface of the annular electrode 205, which makes it possible to suppress generation of a standing wave. In addition, by dividing the annular electrode 205 in the circumferential direction, it is possible to absorb the distortion due to thermal expansion, which makes it possible to prevent the cracking of the insulator member 210. Particularly, by dividing the annular electrode 205 at equal intervals in the circumferential direction, it is possible to improve the uniformity of plasma and to enhance the effect of preventing the cracking of the insulator member 210.

In this regard, the outer circumference of the substrate W, an outer circumference of the lower surface 200a as the plasma exposure surface of the center electrode 200, an inner circumference of the lower surface 205a as the plasma exposure surface of the annular electrode 205, and the outer circumference of the lower surface 205a of the annular electrode 205 are circular. The sizes of the above-described inner or outer circumferences may have a relationship of "the outer diameter of the lower surface 205a of the annular electrode 205>the outer diameter of the substrate W>the inner diameter of the lower surface 205a of the annular electrode 205>the outer diameter of the lower surface 200a of the center electrode 200." The lower surface 200a of the center electrode 200 and the lower surface 205a of the annular electrode 205 are surfaces facing the mounting table 115.

[Impedance Control]

Next, a method for controlling the plasma processing apparatus 10A according to the present embodiment will be described. In the present embodiment, the plasma processing apparatus 10A may include a monitor 600 and a control device 605. The monitor 600 is attached to the hot-side line H1 that connects the impedance variable circuit 400 and the center electrode 200. The monitor 600 measures the high frequency amplitude or the direct current potential of the lower surface 200a of the center electrode 200. The measured high frequency amplitude or direct current potential is sent from the monitor 600 to the control device 605.

The control device 605 is composed of, for example, a computer having a CPU, a ROM, a RAM and an I/F (interface) which are not shown. A target value of the high frequency amplitude or the direct current potential of the lower surface 200a of the center electrode 200 is stored in advance in the RAM of the control device 605. The control device 605 acquires a measured value of the high frequency amplitude or the direct current potential and controls the impedance of the impedance variable circuit 400 so that the high frequency amplitude or the direct current potential of the lower surface 200a of the center electrode 200 is set to the target value. The impedance of the impedance variable circuit 400 is also feedback-controlled during the process.

In the present embodiment, the high frequency wave output from the high frequency power supply 505 is not applied to between the substrate W and the upper electrode 212, but is applied to between the annular electrode 205 and the lid 110 (ground) and output from the insulator member 210. A part of the high frequency wave is consumed for the generation of plasma, and the other part of the high frequency wave is returned to the insulator member 210 as a reflected wave. As described above, the traveling wave of the high frequency wave and the reflected wave interfere with each other, so that the electric field intensity can be strengthened and weakened along the lower surface 200a of the electrode.

In the present embodiment, it is possible to change the impedance between the center electrode 200 and the ground by using the impedance variable circuit 400 connected between the center electrode 200 and the lid 110 (ground). By changing the impedance between the center electrode 200 and the ground, it is possible to change the electric field intensity and the phase of the high frequency wave output from the insulator member 210 existing between the center electrode 200 and the annular electrode 205. Thus, it is possible to achieve a balanced distribution of the electric field intensity of the center electrode 200 and the electric field intensity of the annular electrode 205, which makes it possible to control the distribution of the plasma density.

The impedance control will be described more specifically. First, a case where the reactance Xc between the center electrode 200 and the ground is inductive will be considered. It is assumed that the inductance between the center electrode 200 and the ground is Lc and the capacitance of the sheath formed between the center electrode 200 and the plasma is Cs. If the impedance of the impedance variable circuit 400 is adjusted so that the inductance Lc satisfies the following equation (1), $$Lc = \frac{1}{\omega^2 Cs}, \quad (1)$$

the inductance Lc and the capacitance Cs are in a series resonance state. In the above equation, ω is the plasma excitation angular frequency. At this time, the impedance when looking at the center electrode 200 from the plasma is minimized, and the high frequency current is easier to flow through the center electrode 200 than the ground surface. Therefore, the high frequency current flows only between the annular electrode 205 and the center electrode 200 and does not flow into the ground surface. If the area of the lower surface 205a of the annular electrode 205 is larger than the area of the lower surface 200a of the center electrode 200, a high voltage is applied to the sheath between the center electrode 200 and the plasma, whereby high density plasma is excited. That is, high density plasma is generated in the central portion of the substrate W rather than in the peripheral portion of the substrate W.

When the reactance Xc between the center electrode 200 and the ground is shifted from the resonance state to the positive side or the negative side, the impedance when looking at the center electrode 200 from the plasma at the center electrode 200 is increased, and the high frequency current also flows to the ground surface. When the reactance Xc between the center electrode 200 and the ground is made infinite, i.e., when the center electrode 200 is made to float, the high frequency current does not flow through the center electrode 200 but flows only between the annular electrode 205 and the ground surface. At this time, no high frequency voltage is applied to the sheath between the center electrode 200 and the plasma. Therefore, the plasma is not excited on the front surface of the center electrode 200. That is, high density plasma is generated in the peripheral portion of the substrate rather than in the central portion of the substrate. As described above, by changing the reactance of the impedance variable circuit 400 to change the reactance between the center electrode and the ground, it is possible to control the plasma density distribution.

As described above, according to the plasma processing apparatus 10A of the present embodiment, a high frequency current is caused to flow between the annular electrode 205 and the ground instead of causing a current to flow between the substrate W and the upper electrode. In order to control the plasma density distribution, the impedance variable circuit 400 is provided to control the impedance between the center electrode 200 and the ground. Thus, it is possible to change the electric field intensity and the phase of the high frequency wave supplied from the insulator member 210 existing between the center electrode 200 and the annular electrode 205 to the inside of the processing container. This makes it possible to achieve a balanced distribution of the electric field intensity of the center electrode 200 and the electric field intensity of the annular electrode 205 and to control the plasma density distribution.

In the present embodiment, as an example of the plurality of electrodes insulated from each other and arranged on the surface side of the processing container facing the mounting table 115, there has been described the configuration in which the upper electrode 212 includes the center electrode 200 and the annular electrode 205. However, it suffices that the high frequency power supply 505 is connected between at least one first electrode among the plurality of electrodes and the ground of the processing container to apply a high frequency wave. Furthermore, it suffices that the impedance variable circuit 400 is connected between at least one second electrode different from the first electrode among the plurality of electrodes and the ground of the processing container to control the impedance. The center electrode 200 is an example of the first electrode included in the plurality of electrodes, and the annular electrode 205 is an example of the second electrode included in the plurality of electrodes.

Second Embodiment

[Configuration of Plasma Processing Apparatus]

Figure 5:
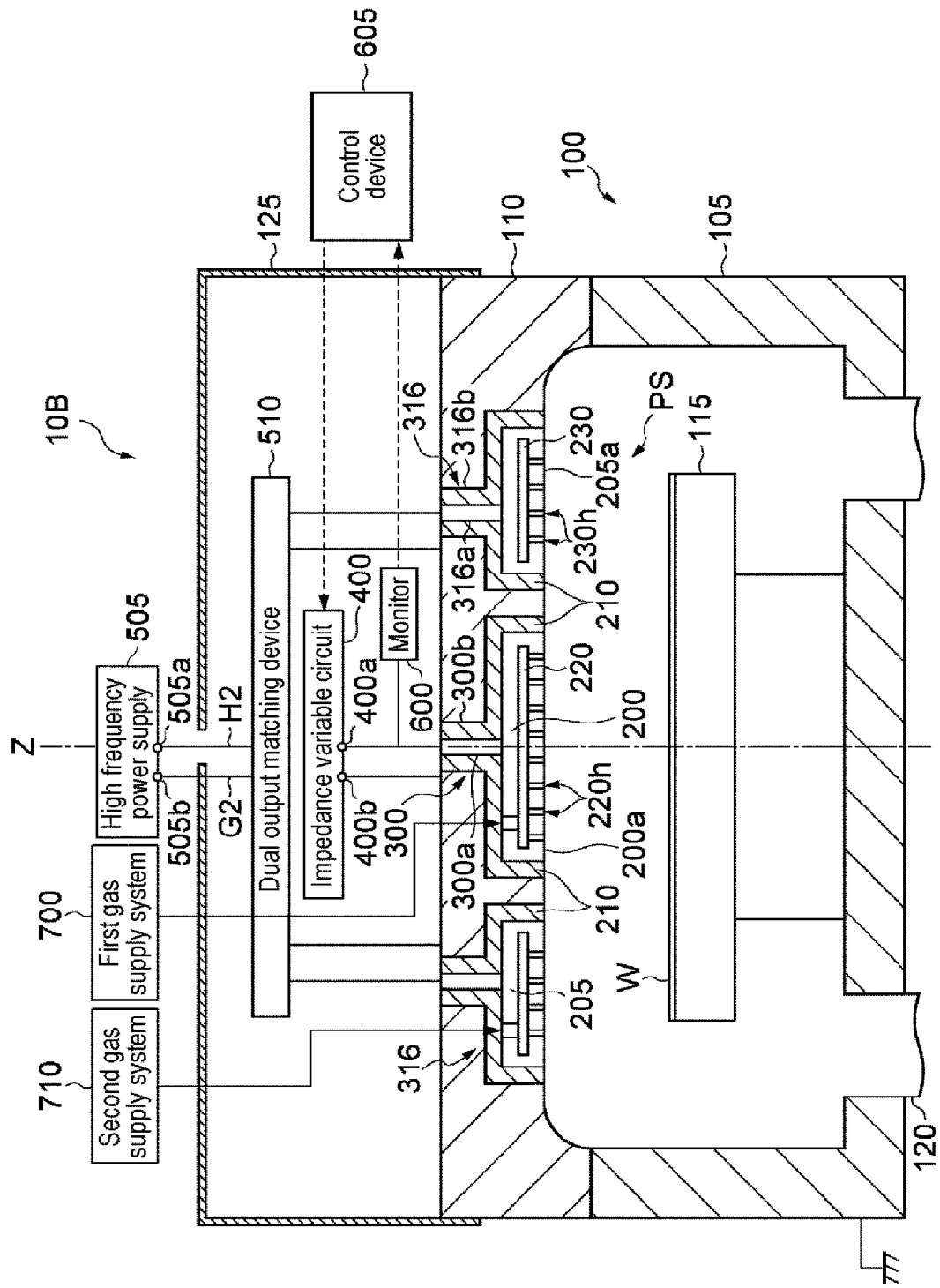
FIG. 5 is a vertical sectional view of a plasma processing apparatus according to a second embodiment.

Next, the configuration of a plasma processing apparatus according to a second embodiment of the present disclosure will be described with reference to FIG. 5. The plasma processing apparatus 10B according to the second embodiment is a modification of the plasma processing apparatus 10A according to the first embodiment. The basic configuration of the second embodiment is the same as that of the first embodiment. Therefore, the configurations different from those of the plasma processing apparatus 10A will now be mainly described.

The plasma processing apparatus 10B according to the second embodiment includes two second coaxial tubes 316 in place of the second coaxial tube 310. Each of the second coaxial tubes 316 includes an inner conductor 316a and an outer conductor 316b. As shown in FIG. 5, one end of the inner conductor 316a of each of the two second coaxial tubes 316 is connected to the annular electrode 205. In addition, the plasma processing apparatus 10B includes a dual output matching device 510 instead of the matching device 500. The dual output matching device 510 has one pair of input ports and two pairs of output ports. The high frequency power supply 505 is connected to the one pair of input ports of the dual output matching device 510. The two pairs of output ports are connected to the other end of the inner conductor 316a of each of the second coaxial tubes 316 and the lid 110 of the processing container 100, respectively. The dual output matching device 510 has both of a branching function and a matching device function. When a branching structure exists in the coaxial tube, the power distribution may sometimes be unbalanced. In contrast, in the dual output matching device 510, it is possible to reduce the unbalanced power distribution. In addition, the plasma processing apparatus 10B further includes a shield 125 electrically connected to the lid 110. The line G2 connecting the dual output matching device 510 and the second power supply terminal 505b of the high frequency power supply 505 is connected to the ground via the shield 125.

The lid 110 is covered with the shield 125. The dual output matching device 510, the impedance variable circuit 400, and the monitor 600 are disposed in the shield 125. The high frequency power supply 505 is connected between the annular electrode 205 and the lid 110 (ground) via the dual output matching device 510 and the two second coaxial tubes 316 so as to apply a high frequency wave to between the annular electrode 205 and the lid 110. The shield 125 prevents the high frequency wave from leaking to the outside of the plasma processing apparatus 10B.

As described above, in the plasma processing apparatus 10B according to the second embodiment, a high frequency current is allowed to flow between the annular electrode 205 and the ground. Furthermore, the impedance between the center electrode 200 and the ground is controlled by the impedance variable circuit 400. Thus, it is possible to change the electric field intensity and the phase of the high frequency wave supplied from the insulator member 210 existing between the center electrode 200 and the annular electrode 205 to the inside of the processing container 100. This makes it possible to achieve a balanced distribution of the electric field intensity of the center electrode 200 and the electric field intensity of the annular electrode 205 and to control the plasma density distribution.

Third Embodiment

[Configuration of Plasma Processing Apparatus]

Figure 6:
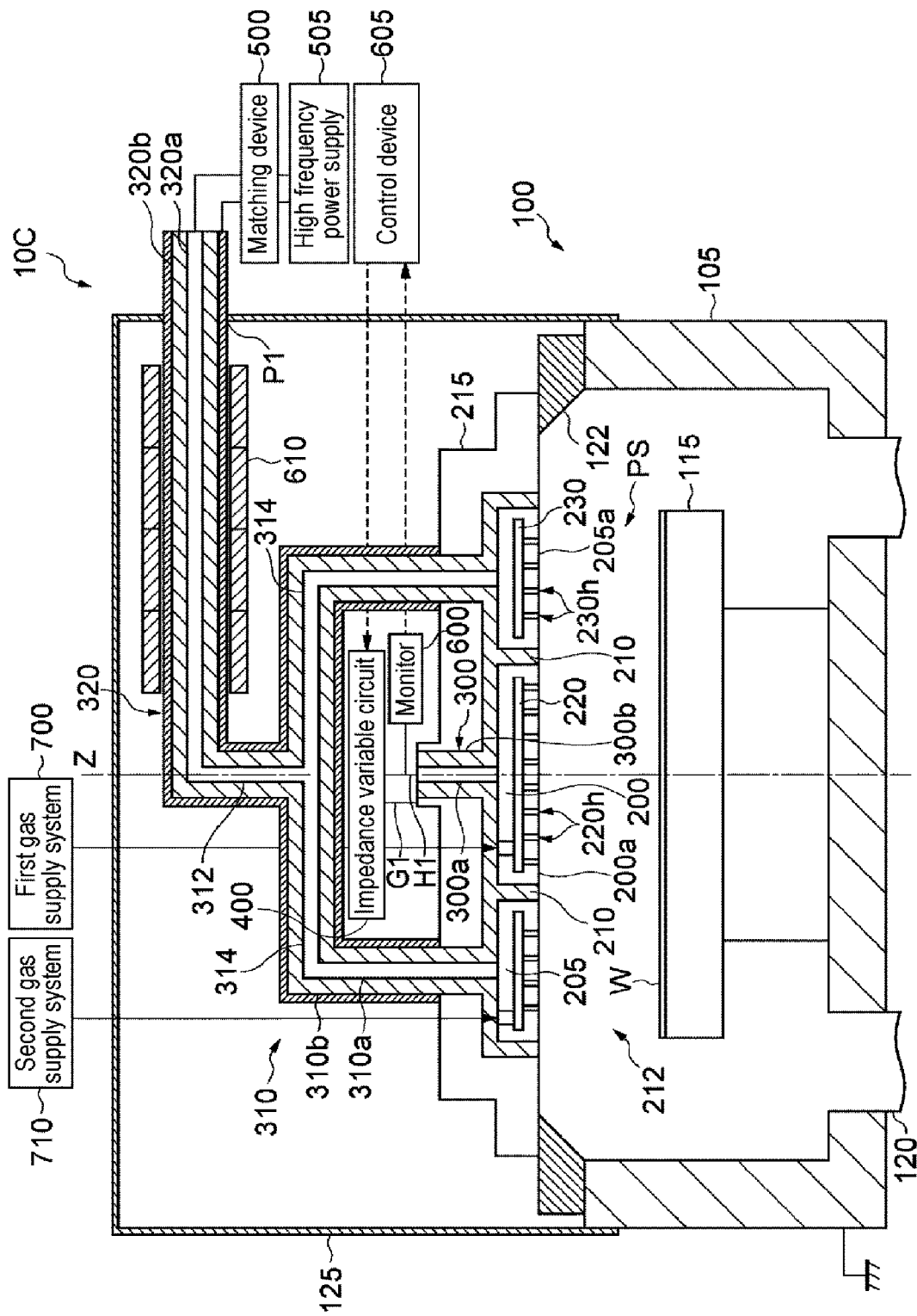
FIG. 6 is a vertical sectional view of a plasma processing apparatus according to a third embodiment.

Next, the configuration of a plasma processing apparatus according to a third embodiment of the present disclosure will be described with reference to FIG. 6. Hereinafter, the differences from the plasma processing apparatus 10A will mainly be described. In the plasma processing apparatus 10C according to the third embodiment, the upper electrode 212 is divided into three parts, i.e., a center electrode 200, an annular electrode 205, and an outer peripheral electrode 215. The shapes and arrangement positions of the center electrode 200 and the annular electrode 205 are substantially the same as those in the first embodiment. The outer peripheral electrode 215 is provided so as to surround the outer peripheral side of the annular electrode 205.

The outer peripheral electrode 215 is formed at a position where the lid 110 is provided in the first and second embodiments. An insulating ring 122 is provided between the outer edge portion of the outer peripheral electrode 215 and the container body 105, whereby the processing container 100 and the outer peripheral electrode 215 are insulated from each other. Between the outer peripheral electrode 215 and the ground, there is provided a short-circuit portion P1 for electrically short-circuiting a portion between the outer peripheral electrode 215 and the matching device 500. Thus, the outer peripheral electrode 215 is in a floating state in terms of electricity and high frequency, but the outer peripheral electrode 215 is connected to the ground in terms of a transmission path (direct current). A short-circuit portion may be provided at a position where the matching device 500 and the high frequency power supply 505 are electrically short-circuited.

The center electrode 200, the annular electrode 205, and the outer peripheral electrode 215 are formed of metal members. Insulator members 210 are interposed between the center electrode 200 and the annular electrode 205 and between the annular electrode 205 and the outer peripheral electrode 215, respectively. The center electrode 200, the annular electrode 205, and the outer peripheral electrode 215 are insulated from one another.

In the plasma processing apparatus 10C, one end of the inner conductor 300a of the first coaxial tube 300 is connected to the impedance variable circuit 400 via the line H1. The inner conductor 300a of the first coaxial tube extends so as to penetrate the outer peripheral electrode 215 and the insulator member 210, and the other end of the first coaxial tube 300 is connected to the center electrode 200.

The second coaxial tube 310 is branched into two coaxial tubes at an intermediate position in the length direction. The number of branches of the second coaxial tube 310 is not limited to two branches and may be, for example, four branches, eight branches, or other number of branches. The inner conductor 310a of the second coaxial tube 310 includes a first portion 312 and two second portions 314 branched from the first portion 312. The two second portions 314 extend so as to penetrate the outer peripheral electrode 215 and the insulator member 210 and are connected to the annular electrode 205. These two second portions 314 are connected to the annular electrode 205 at a position axially symmetrical with respect to the axis Z passing through the center of the center electrode 200. Furthermore, the upper end of the second coaxial tube 310 is connected to a third coaxial tube 320. The third coaxial tube 320 is connected to the high frequency power supply 505 via the matching device 500.

The high frequency power supply 505 is connected between the outer peripheral electrode 215 and the annular electrode 205 via the matching device 500 to apply a high frequency wave to between the outer peripheral electrode 215 and the annular electrode 205. If a high frequency current flows through the substrate W, it is impossible to independently control the current flowing through the substrate W. However, in the present embodiment, a high frequency current flows only between the electrodes and does not flow through the substrate W. This will be described.

In the plasma processing apparatus 10C, an annular ferrite 610 is provided in the vicinity of the outer periphery of a part of the third coaxial tube 320 in order to prevent a high frequency current from flowing to the ground side due to the occurrence of a common mode. The ferrite 610 functions as a common mode choke provided in at least a part of the high frequency transmission path connecting the short-circuit portion P1 and the outer peripheral electrode 215. Since the ferrite has high permeability, the ferrite acts as a large inductance to the common mode current flowing through the third coaxial tube 320. This makes it possible to suppress the common mode current. By disposing the ferrite 610 on the third coaxial tube 320 as described above, it is possible to prevent a high frequency bias from being applied to the substrate W by the high frequency wave applied to the annular electrode 205. Thus, it is possible to independently control the potential of the surface of the substrate W and the distribution of the plasma density.

In the plasma processing apparatus 10C, the outer peripheral electrode 215 is grounded via an outer conductor 320b of the third coaxial tube 320 that connects the outer peripheral electrode 215 and the matching device 500. Therefore, at a high frequency, the impedance between the outer conductor 320b and the ground is increased to some extent. Accordingly, it is not always necessary to provide the common mode choke.

The impedance variable circuit 400 according to the present embodiment is connected to between the outer peripheral electrode 215 and the center electrode 200 to control the impedance between the outer peripheral electrode 215 and the center electrode 200. Also in the present embodiment, the monitor 600 is connected to the hot-side line H1 that connects the impedance variable circuit 400 and the center electrode 200. The monitor 600 measures a high frequency amplitude or a direct current potential of the lower surface 200a of the center electrode 200, and sends the measured high frequency amplitude or the measured direct current potential to the control device 605. The control device 605 performs feedback control of the impedance of the impedance variable circuit 400 based on the measured value of the high frequency amplitude or the direct current potential so that the high frequency amplitude or the direct current potential of the plasma exposure surface of the center electrode 200 is set to a target value.

The balance of the high frequency currents flowing through the plasma to the surfaces of the center electrode 200, the annular electrode 205, and the outer peripheral electrode 215 is determined by the phase difference and the intensity difference of the surface wave discharged from between the center electrode 200 and the annular electrode 205 and between the annular electrode 205 and the outer peripheral electrode 215 and propagating between each electrode and the plasma. By changing the reactance of the impedance variable circuit 400 in the plasma processing apparatus 10C, it is possible to allow a high frequency current to flow, for example, only between the center electrode 200 and the annular electrode 205, only between the center electrode 200 and the outer peripheral electrode 215, or only between the annular electrode 205 and the outer peripheral electrode 215. It is also possible to allow a high frequency current to flow between these electrodes at an arbitrary ratio. Furthermore, it is also possible to allow a high frequency current to uniformly flow to the three electrodes. According to the plasma processing apparatus 10C, the plasma density distribution in the radial direction of the substrate W can be freely controlled by changing the reactance of the impedance variable circuit 400 in this manner.

As described above, according to the plasma processing apparatus 10C of the present embodiment, the high frequency wave is applied to between the outer peripheral electrode 215 and the annular electrode 205 to control the impedance between the outer peripheral electrode 215 and the center electrode 200. Thus, it is possible to achieve a balanced distribution of the electric field intensity of the center electrode 200 and the electric field intensity of the annular electrode 205 and to control the distribution of the plasma density. In particular, since the outer peripheral electrode 215 is in a floating state, even if the impedance is variable, it is possible to prevent the high frequency current from flowing to the ground side. Therefore, it is possible to easily control the impedance and to enhance the control accuracy.

In the present embodiment, there has been described the configuration in which the upper electrode 212 includes three electrodes, i.e., the center electrode 200, the annular electrode 205, and the outer peripheral electrode 215. The center electrode 200 is an example of a first electrode, the annular electrode 205 is an example of a second electrode, and the outer peripheral electrode 215 is an example of a third electrode. It suffices that the high frequency power supply 505 applies a high frequency wave to between the third electrode and the second electrode and further that the impedance variable circuit 400 controls the impedance between the third electrode and the first electrode.

Fourth Embodiment

[Configuration of Plasma Processing Apparatus]

Figure 7:
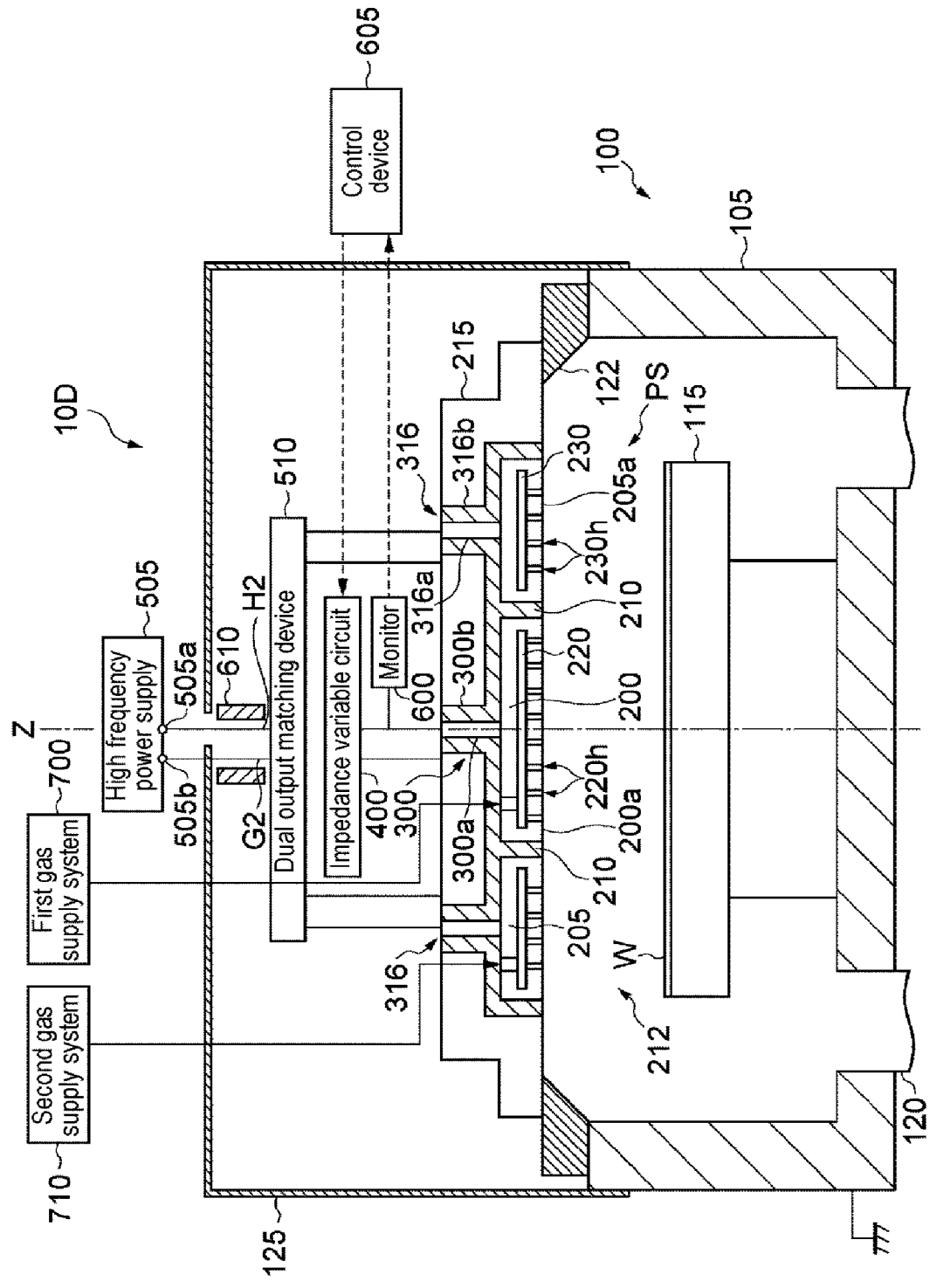
FIG. 7 is a vertical sectional view of a plasma processing apparatus according to a fourth embodiment.

Next, the configuration of a plasma processing apparatus according to a fourth embodiment of the present disclosure will be described with reference to FIG. 7. The plasma processing apparatus 10D according to the fourth embodiment is a modification of the plasma processing apparatus 10C according to the third embodiment. The basic configuration is the same as that of the third embodiment. Therefore, the configurations different from those of the plasma processing apparatus 10C will mainly be described.

The plasma processing apparatus 10D according to the fourth embodiment includes two second coaxial tubes 316 instead of the second coaxial tube 310. As shown in FIG. 7, one end of the inner conductor 316a of each of the two second coaxial tubes 316 is connected to the annular electrode 205. In addition, the plasma processing apparatus 10D includes a dual output matching device 510 instead of the matching device 500. The dual output matching device 510 has one pair of input ports and two pairs of output ports. The high frequency power supply 505 is connected to the one pair of input ports of the dual output matching device 510. Each of the two pairs of output ports is connected to the inner conductor 316a of each of the two second coaxial tubes 316 and the outer peripheral electrode 215. The dual output matching device 510 has both of a branching function and a matching device function. When the branch structure is adopted in the coaxial tube, the power distribution may be unbalanced. In contrast, in the dual output matching device 510, it is possible to reduce the unbalance of the power distribution. A ferrite 610 is provided between the dual output matching device 510 and the high frequency power supply 505. In addition, the plasma processing apparatus 10D further includes a shield 125 electrically connected to the container body 105. A line G2 connecting the dual output matching device 510 and the second power supply terminal 505b is connected to the ground via the shield 125.

The outer peripheral electrode 215 is covered with the shield 125. The dual output matching device 510, the impedance variable circuit 400, and the monitor 600 are disposed in the shield 125. The high frequency power supply 505 is connected between the annular electrode 205 and the outer peripheral electrode 215 via the dual output matching device 510 and the two second coaxial tubes 310 so as to apply a high frequency wave to between the annular electrode 205 and the outer peripheral electrode 215. The shield 125 prevents the high frequency wave from leaking to the outside of the plasma processing apparatus 10D.

As described above, according to the plasma processing apparatus 10D of the fourth embodiment, the high frequency wave is applied to between the annular electrode 205 and the outer peripheral electrode 215, and the impedance between the center electrode 200 and the outer peripheral electrode 215 is controlled. This makes it possible to control the flow of the high frequency current between the electrodes and to control the plasma density distribution.

Fifth Embodiment

[Configuration of Plasma Processing Apparatus]

Figure 8:
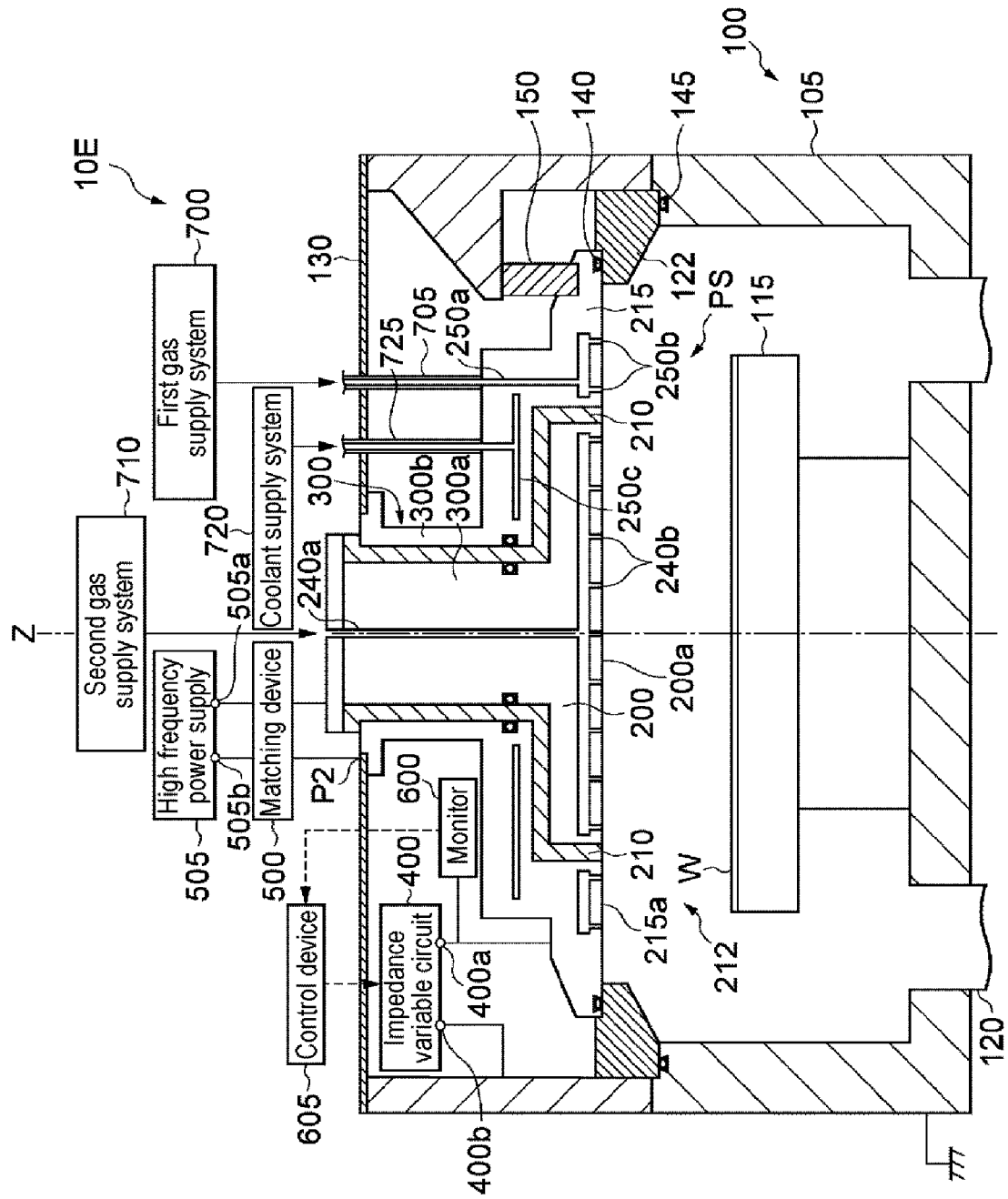
FIG. 8 is a vertical sectional view of a plasma processing apparatus according to a fifth embodiment.

Next, the configuration of a plasma processing apparatus according to a fifth embodiment of the present disclosure will be described with reference to FIG. 8. Hereinafter, the differences from the above-described plasma processing apparatus will mainly be described. In the plasma processing apparatus 10E according to the fifth embodiment, the upper electrode 212 is divided into two electrodes, i.e., a center electrode 200 and an outer peripheral electrode 215. The center electrode 200 and the outer peripheral electrode 215 are insulated from each other with an insulator member 210 interposed therebetween.

The plasma processing apparatus 10E includes a first coaxial tube 300. One end of the inner conductor 300a of the first coaxial tube 300 is connected to a matching device 500. The inner conductor 300a of the first coaxial tube 300 extends so as to penetrate the outer peripheral electrode 215 and the insulator member 210, and the other end of the inner conductor 300a is connected to the center electrode 200. The outer conductor 300b of the first coaxial tube 300 is connected to the outer peripheral electrode 215.

An insulating ring 122 is provided between the outer edge portion of the outer peripheral electrode 215 and the container body 105, whereby the processing container 100 and the outer peripheral electrode 215 are insulated from each other. Thus, the outer peripheral electrode 215 is in a floating state in terms of electricity and high frequency, but the outer peripheral electrode 215 is connected to the ground in terms of a transmission path (direct current). O-rings 140 and 145 are provided on the upper and lower sides of the insulating ring 122. By pressing and crushing the insulating ring 122 and the O-rings 140 and 145 with an insulator retainer 150, the processing space PS inside the processing container 100 is sealed from the atmospheric space above the outer peripheral electrode 215.

In the plasma processing apparatus 10E, the outer periphery of the substrate W, the outer periphery of the lower surface 200a of the center electrode 200, the inner periphery of the lower surface 215a of the outer peripheral electrode 215, and the outer periphery of the lower surface 215a of the outer peripheral electrode 215 are circular. The sizes of the above-described inner or outer peripheries have the relationship of "the outer diameter of the lower surface 215a of the outer peripheral electrode 215>the outer diameter of the substrate W>the inner diameter of the lower surface 215a of the outer peripheral electrode 215>the outer diameter of the lower surface 200a of the center electrode 200."

The gas supply path is formed of two systems, i.e., a first gas supply system 700 and a second gas supply system 710, so that the flow rate ratio can be changed by an inner gas system and an outer gas system. The first gas supply system 700 introduces a first gas into a gas supply pipe 705 penetrating an upper cover 130. The introduced first gas is allowed to flow through a gas path 250a formed inside the outer peripheral electrode 215 and communicating with the gas supply pipe 705 and is supplied into the processing container 100 from first gas holes 250b. The second gas supply system 710 introduces a second gas into a gas path 240a formed in the inner conductor 300a of the first coaxial tube. The second gas is supplied into the processing container from second gas holes 240b.

A coolant supply system 720 supplies a coolant to a coolant supply pipe 725. The supplied coolant flows through an annular coolant path 250c kept in communication with the coolant supply pipe 725 and formed inside the outer peripheral electrode 215, thereby adjusting the temperature of the outer peripheral electrode 215.

Although the above-described plasma processing apparatuses 10A, 10B, 10C, and 10D do not include the coolant supply system 720, the coolant supply system 720 may also be applied to the plasma processing apparatuses 10A, 10B, 10C, and 10D.

The high frequency power supply 505 of the plasma processing apparatus 10E is connected between the outer peripheral electrode 215 and the center electrode 200 via a matching device 500 to supply a high frequency current to between the outer peripheral electrode 215 and the center electrode 200. Between the outer peripheral electrode 215 and the grounded processing container 100, there is provided a short-circuit portion P2 for electrically short-circuiting the outer peripheral electrode 215 and the matching device 500. A short-circuit portion may be provided between the outer peripheral electrode 215 and the processing container 100 to electrically short-circuit the matching device 500 and the high frequency power supply 505.

The impedance variable circuit 400 of the plasma processing apparatus 10E is connected between the outer peripheral electrode 215 and the grounded processing container 100 so as to control the impedance. Although only one impedance variable circuit 400 is shown in FIG. 8, in one embodiment, a plurality of impedance variable circuits 400 may be connected to the outer peripheral electrode 215 and the processing container 100 at positions axially symmetrical with respect to the axis Z passing through the center of the center electrode 200.

In the plasma processing apparatus 10E, the outer peripheral electrode 215 is grounded via an outer conductor 300b that connects the outer peripheral electrode 215 and the matching device 500. Therefore, at a high frequency, the impedance between the outer conductor 300b and the ground is increased to some extent. Accordingly, if the impedance of the impedance variable circuit 400 is high, most of the high frequency current flows between the center electrode 200 and the outer peripheral electrode 215 and hardly flows to the ground surface. If the areas of the lower surfaces of the center electrode 200 and the outer peripheral electrode 215 are substantially equal to each other, a substantially-equal high frequency voltage is applied to a sheath between the center electrode 200 and the plasma and a sheath between the outer peripheral electrode 215 and the plasma.

For example, if the impedance between the outer peripheral electrode 215 and the ground is made infinite without providing the impedance variable circuit 400, a high frequency current flows only between the outer peripheral electrode 215 and the center electrode 200 and does not flow to the ground. On the other hand, if the reactance of the impedance variable circuit 400 is set to a finite value, a high frequency current also flows to the ground surface according to the reactance. If a high frequency current having the same phase as that of the outer peripheral electrode 215 is allowed to flow to the ground surface, the high frequency current flowing through the center electrode 200 becomes large so that high density plasma is excited below the center electrode 200. Conversely, if a high frequency current having the same phase as that of the center electrode 200 is allowed to flow to the ground surface, the high frequency current flowing through the outer peripheral electrode 215 becomes large so that high density plasma is excited below the outer peripheral electrode 215.

Also in the present embodiment, the control device 605 can freely control the plasma density distribution in the radial direction of the substrate W by controlling the reactance of the impedance variable circuit 400 based on the measured value of the monitor 600. Furthermore, in the plasma processing apparatus 10E according to the present embodiment, it is possible to reduce the number of electrodes as compared with the third and fourth embodiments. It is also possible to simplify the structure since the branching can be made unnecessary.

In the present embodiment, there has been described the configuration including the center electrode 200 and the outer peripheral electrode 215. However, among the first electrode and the second electrode which are insulated from each other and arranged on the surface side facing the mounting table of the processing container, the center electrode 200 is an example of the first electrode, and the outer peripheral electrode 215 is an example of the second electrode.

Sixth Embodiment

[Configuration of Plasma Processing Apparatus]

Figure 9:
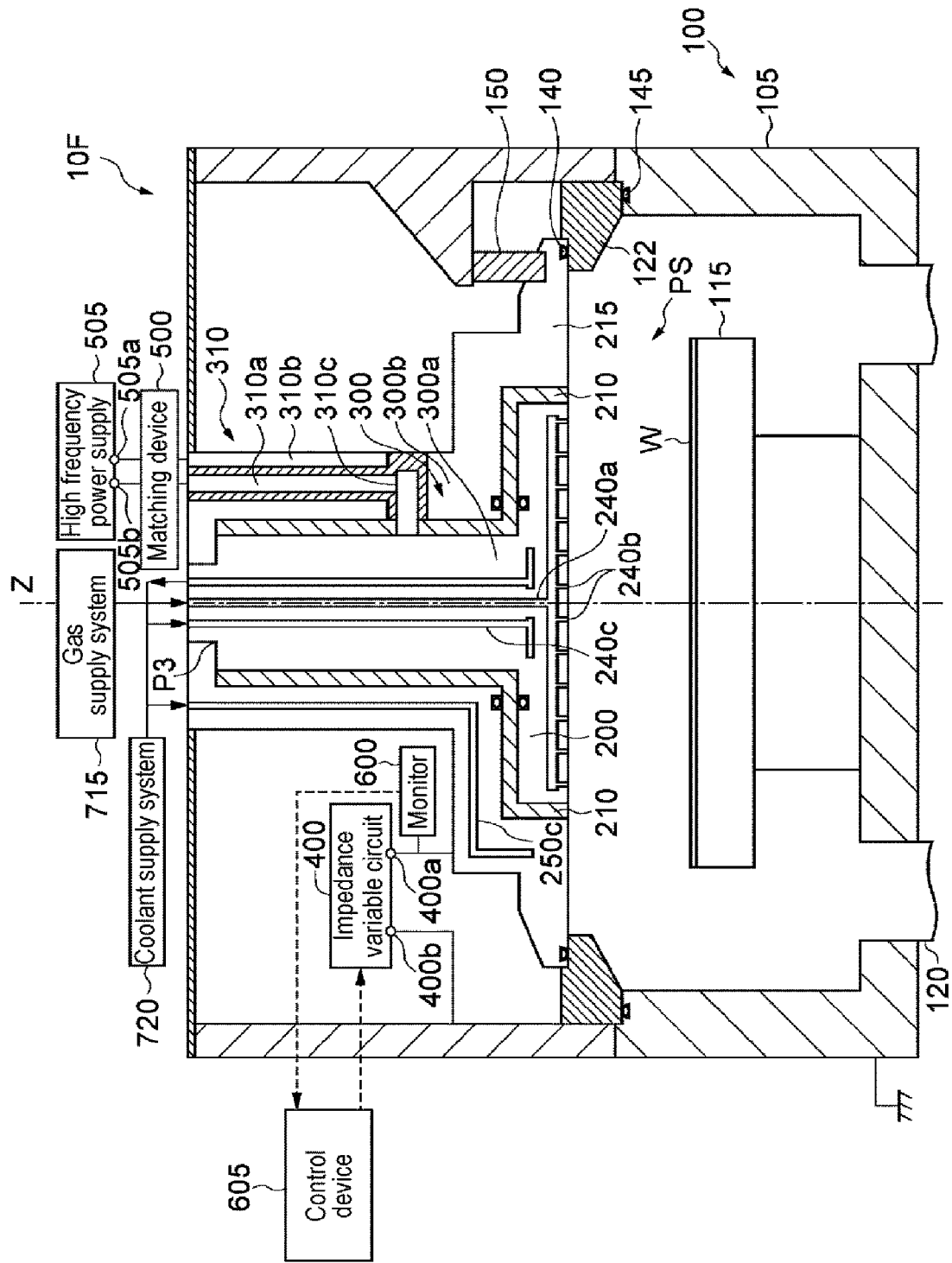
FIG. 9 is a vertical sectional view of a plasma processing apparatus according to a sixth embodiment.

Next, the configuration of a plasma processing apparatus according to a sixth embodiment of the present disclosure will be described with reference to FIG. 9. The plasma processing apparatus 10F according to the sixth embodiment is a modification of the plasma processing apparatus 10E according to the fifth embodiment. The basic configuration thereof is the same as that of the fifth embodiment. Therefore, the configurations different from those of the plasma processing apparatus 10E will be mainly described.

In the plasma processing apparatus 10F of the present embodiment, there is provided a short-circuit portion P3 for electrically short-circuiting the outer conductor 300b and the inner conductor 300a of the first coaxial tube 300. The center electrode 200 is grounded via the inner conductor 300a and the outer conductor 300b.

Furthermore, in the present embodiment, the plasma processing apparatus 10F includes a second coaxial tube 310 having one end connected to the first coaxial tube 300 and the other end connected to the matching device 500. The second coaxial tube 310 is connected to the first coaxial tube 300 by a metal member 310c, which connects the inner conductor 310a and the inner conductor 300a, to supply power from the sidewall of the first coaxial tube 300.

A gas supply system 715 allows a gas to flow into a gas path 240a formed inside the first coaxial tube 300 and supplies the gas into the processing container from the gas holes 240b. The coolant supply system 720 adjusts the temperatures of the center electrode 200 and the outer peripheral electrode 215 by allowing a coolant to flow through a coolant path 240c formed in the inner conductor 300a and a coolant path 250c formed in the outer conductor 300b.

In the present embodiment, it is possible to simplify the configurations of the gas supply system 715 and the coolant supply system 720 because the center electrode 200 is grounded.

Although the above-described plasma processing apparatuses 10A, 10B, 10C, and 10D do not include the coolant supply system 720, the coolant supply system 720 may also be applied to the plasma processing apparatuses 10A, 10B, 10C, and 10D.

As described above, according to the plasma processing apparatus 10F of the present embodiment, the plasma density distribution in the radial direction of the substrate W can be freely controlled by variably controlling the reactance of the impedance variable circuit 400. Furthermore, in the plasma processing apparatus 10F according to the present embodiment, it is possible to reduce the number of electrodes as compared with the third and fourth embodiments. It is also possible to simplify the structure since the branching can be made unnecessary.

As described above, according to the plasma processing apparatuses of the first to sixth embodiments, the electrode to which a high frequency wave is applied and the electrode to which the impedance variable circuit is connected are provided and the impedance of the electrode is changed, whereby the distribution of the plasma density can be controlled by changing the flow of the high frequency current between the electrodes or between the electrode and the ground. That is, the intensity and the phase of the high frequency wave propagating on the surface of the electrode can be changed by controlling the impedance between two different electrodes connected to the variable impedance circuit or between one electrode and the processing container. As a result, it becomes possible to change the distribution of the standing wave on the surface of the electrode and to control the distribution of the plasma density.

Although the preferred embodiments of the present disclosure have been described in detail with reference to the accompanying drawings, the present disclosure is not limited to such examples. It is obvious that those skilled in the art to which the present disclosure belongs can make various modifications or changes within the scope of the technical idea recited in the claims. It is to be understood that these modifications or changes may well fall within the technical scope of the present disclosure.

For example, the plasma processing apparatus according to the present disclosure is mainly used as a semiconductor manufacturing apparatus. However, the plasma processing apparatus may be used in a substrate processing apparatus. For example, the plasma processing apparatus may be used in a flat panel display manufacturing process or a solar cell manufacturing process, in addition to the semiconductor manufacturing process. Therefore, the workpiece is not limited to the silicon substrate and may be a glass substrate.

In addition, the upper electrode 212 may include any number of electrodes as long as it includes a plurality of electrodes. Furthermore, it suffices that the high frequency power supply 505 is electrically connected between the two different electrodes out of the plurality of electrodes of the upper electrode 212 or between one electrode out of the plurality of electrodes of the upper electrode 212 and the processing container 100. Moreover, it suffices that the impedance variable circuit 400 is electrically connected between the two different electrodes out of the plurality of electrodes of the upper electrode 212 or between one electrode out of the plurality of electrodes of the upper electrode 212 and the processing container 100. With such a configuration, by controlling the impedance of the impedance variable circuit, it is possible to change the intensity and the phase of the high frequency wave propagating on the surface of the electrode. As a result, it becomes possible to change the distribution of the standing wave on the surface of the electrode and to control the distribution of the plasma density.

EXPLANATION OF REFERENCE NUMERALS 10A, 10B, 10C, 10D, 10E, 10F: plasma processing apparatus, 100: processing container, 115: mounting table, 200: center electrode, 205: annular electrode, 210: insulator member, 212: upper electrode, 215: outer peripheral electrode, 300: first coaxial tube, 300a: inner conductor, 300b: outer conductor, 310: second coaxial tube, 310a: inner conductor, 310b: outer conductor, 312: first portion, 314: second portion, 316: second coaxial tube, 316a: inner conductor, 320: third coaxial tube, 320b: outer conductor, 400: impedance variable circuit, 500: matching device, 505: high frequency power supply, 510: dual output matching device, 600: monitor, 605: control device, 610: ferrite, P1, P2, P3: short-circuit portion, W: substrate, Z: axis

What is claimed is:

1. A plasma processing apparatus comprising:
a grounded processing container;
a mounting table configured to support a workpiece inside the processing container;
a plurality of electrodes arranged to face the mounting table and insulated from one another:
a high frequency power supply configured to supply a high frequency power for generating plasma, and electrically connected between two different electrodes out of the plurality of electrodes or between one of the plurality of electrodes and the processing container; and
an impedance variable circuit configured to control an impedance, and electrically connected between two different electrodes out of the plurality of electrodes or between one of the plurality of electrodes and the processing container,
wherein the plurality of electrodes includes a first electrode and a second electrode,
wherein the high frequency power supply is electrically connected between the second electrode and the processing container, and
wherein the impedance variable circuit is connected between the first electrode and the processing container.

2. The plasma processing apparatus of claim 1, wherein the first electrode is a disk-shaped center electrode, and the second electrode is an annular electrode surrounding an outer periphery of the center electrode, and
wherein the high frequency power supply is electrically connected to the annular electrode and the processing container via a matching device.

3. The plasma processing apparatus of claim 2, wherein the annular electrode and the center electrode are formed of metal members, and an insulator member is interposed between the annular electrode and the center electrode.

4. The plasma processing apparatus of claim 2, further comprising a first coaxial tube,
wherein one end of an inner conductor of the first coaxial tube is connected to the impedance variable circuit, and the other end of the inner conductor is connected to the center electrode.

5. The plasma processing apparatus of claim 2, further comprising a second coaxial tube including an inner conductor having a first portion and a plurality of second portions branched from the first portion,
wherein an end portion of the first portion is connected to the matching device, and end portions of the plurality of second portions are connected to the annular electrode at positions axially symmetrical with respect to an axis passing through a center of the center electrode.

6. The plasma processing apparatus of claim 5, wherein the end portions of the plurality of second portions are connected to the annular electrode at positions equidistant in a circumferential direction of the annular electrode.

7. The plasma processing apparatus of claim 2, wherein an outer periphery of the workpiece, an outer periphery of a surface of the center electrode facing the mounting table, an inner periphery of a surface of the annular electrode facing the mounting table, and an outer periphery of the surface of the annular electrode facing the mounting table are circular, and
wherein the workpiece, the center electrode, and the annular electrode have a relationship of an outer diameter of the surface of the annular electrode facing the mounting table >an outer diameter of the workpiece >an inner diameter of the surface of the annular electrode facing the mounting table >an outer diameter of the surface of the center electrode facing the mounting table.

8. The plasma processing apparatus of claim 2, wherein the annular electrode is divided into a plurality of regions at equal intervals in a circumferential direction of the annular electrode.

9. A plasma processing apparatus comprising:
a grounded processing container;
a mounting table configured to support a workpiece inside the processing container;
a plurality of electrodes arranged to face the mounting table and insulated from one another:
a high frequency power supply configured to supply a high frequency power for generating plasma, and electrically connected between two different electrodes out of the plurality of electrodes or between one of the plurality of electrodes and the processing container; and
an impedance variable circuit configured to control an impedance, and electrically connected between two different electrodes out of the plurality of electrodes or between one of the plurality of electrodes and the processing container,
wherein the plurality of electrodes includes a first electrode, a second electrode, and a third electrode, wherein the high frequency power supply is electrically connected between the second electrode and the third electrode, and wherein the impedance variable circuit is electrically connected between the first electrode and the third electrode.

10. The plasma processing apparatus of claim 9, wherein the high frequency power supply is electrically connected between the second electrode and the third electrode via a matching device, and wherein the third electrode is grounded via the matching device and the high frequency power supply.

11. The plasma processing apparatus of claim 10, wherein a common mode choke is provided in at least a part of a high frequency transmission path connecting the high frequency power supply and the third electrode.

12. The plasma processing apparatus of claim 10, wherein the first electrode is a disk-shaped center electrode, wherein the second electrode is an annular electrode surrounding an outer periphery of the center electrode, and wherein the third electrode is an outer peripheral electrode surrounding an outer periphery of the annular electrode.

13. The plasma processing apparatus of claim 12, wherein the center electrode, the annular electrode, and the outer peripheral electrode are formed of metal members, and wherein an insulator member is interposed between the center electrode and the annular electrode and between the annular electrode and the outer peripheral electrode.

14. The plasma processing apparatus of claim 12, further comprising a first coaxial tube, wherein one end of an inner conductor of the first coaxial tube is connected to the impedance variable circuit, and the other end of the inner conductor is connected to the center electrode.

15. The plasma processing apparatus of claim 12, further comprising a second coaxial tube including an inner conductor having a first portion and a plurality of second portions branched from the first portion, wherein an end portion of the first portion is connected to the matching device, and end portions of the plurality of second portions are connected to the annular electrode at positions axially symmetrical with respect to an axis passing through a center of the center electrode.

16. A plasma processing apparatus comprising:
a grounded processing container;
a mounting table configured to support a workpiece inside the processing container;
a plurality of electrodes arranged to face the mounting table and insulated from one another:
a high frequency power supply configured to supply a high frequency power for generating plasma, and electrically connected between two different electrodes out of the plurality of electrodes or between one of the plurality of electrodes and the processing container; and
an impedance variable circuit configured to control an impedance, and electrically connected between two different electrodes out of the plurality of electrodes or between one of the plurality of electrodes and the processing container, wherein the plurality of electrodes includes a first electrode and a second electrode, wherein the high frequency power supply is electrically connected between the first electrode and the second electrode, and wherein the impedance variable circuit is connected between the second electrode and the processing container.

17. The plasma processing apparatus of claim 16, wherein the high frequency power supply is electrically connected to the first electrode and the second electrode via a matching device, and wherein the second electrode is grounded via the matching device and the high frequency power supply.

18. The plasma processing apparatus of claim 17, wherein the first electrode is a disk-shaped center electrode, and wherein the second electrode is an outer peripheral electrode surrounding an outer periphery of the center electrode.

19. The plasma processing apparatus of claim 18, wherein the center electrode and the outer peripheral electrode are formed of metal members, and wherein an insulator member is interposed between the center electrode and the outer peripheral electrode.

20. The plasma processing apparatus of claim 18, further comprising a first coaxial tube, wherein one end of an inner conductor of the first coaxial tube is connected to the matching device, and the other end of the inner conductor is connected to the center electrode.

21. The plasma processing apparatus of claim 20, wherein one end of the inner conductor of the first coaxial tube is electrically short-circuited from an end portion of an outer conductor of the first coaxial tube.

22. The plasma processing apparatus of claim 20, further comprising a second coaxial tube having one end electrically connected to the first coaxial tube and the other end electrically connected to the matching device.

23. The plasma processing apparatus of claim 18, wherein an outer periphery of the workpiece, an outer periphery of a surface of the center electrode facing the mounting table, an inner periphery of a surface of the outer peripheral electrode facing the mounting table, and an outer periphery of the surface of the outer peripheral electrode facing the mounting table are circular, and wherein the workpiece, the center electrode, and the outer peripheral electrode have a relationship of an outer diameter of the surface of the outer peripheral electrode facing the mounting table >an outer diameter of the workpiece >an inner diameter of the surface of the outer peripheral electrode facing the mounting table >an outer diameter of the surface of the center electrode facing the mounting table.

24. The plasma processing apparatus of claim 18, wherein the impedance variable circuit is connected to the outer peripheral electrode at a plurality of positions axially symmetrical with respect to an axis passing through a center of the center electrode.

* * * * *